United States Patent [19]

Kochsmeier

[11] 4,311,352

[45] Jan. 19, 1982

[54] APPARATUS FOR EFFECTING ELECTRICAL CONNECTIONS WITH MULTIPLE CONTACT POINTS

[75] Inventor: Ralph W. Kochsmeier, Harrisonville, Mo.

[73] Assignee: DIT-MCO International Corporation, Kansas City, Mo.

[21] Appl. No.: 154,924

[22] Filed: May 30, 1980

[51] Int. Cl.³ .......................................... H01R 13/24
[52] U.S. Cl. ................................................. 339/18 R
[58] Field of Search ............ 339/17 LM, 17 M, 17 N, 339/18 R, 18 C, 18 P, 18 B

[56] References Cited

U.S. PATENT DOCUMENTS

| | | | |
|---|---|---|---|
| 3,205,469 | 9/1965 | Frank et al. | 339/18 C |
| 3,212,049 | 10/1965 | Mittler et al. | 339/17 M X |
| 3,302,065 | 1/1967 | Karol et al. | 339/18 B |
| 3,432,796 | 3/1969 | Reimer | 339/18 R |
| 3,654,585 | 4/1972 | Wickersham | 339/17 M |
| 4,082,394 | 4/1978 | Bedney et al. | 339/17 M |

*Primary Examiner*—Stephen G. Kunin
*Assistant Examiner*—Robert P. Olszewski
*Attorney, Agent, or Firm*—Schmidt, Johnson, Hovey & Williams

[57] ABSTRACT

An improved construction is provided for interfacing board type interconnect system apparatus for use in effecting a multiplicity of concurrent, respective, electrical connections with closely spaced, typically irregularly arranged, contactable, electrically conductive zones of a printed circuit board or the like, such as is required, for example, in the testing of such devices. The apparatus employs a preferably laminated assembly of stacked, electrically insulative plates, including support plates pre-drilled to provide a matrix of relatively small and closely spaced holes for mounting spring pin type contactor assemblies and backing plates for physical reinforcement of the support plates and pre-drilled to provide a matrix of relatively larger and less closely spaced openings each communicating with a plurality of the mentioned holes to present a clearance path for electrical leads associated with the contactor assemblies. The construction utilized minimizes the drilling required to produce interfacing boards of requisite physical strength, precision, reliability and versatility for use in effecting a multiplicity of electrical connections with the test points of printed circuit board or similar devices having various arrangements of contactable zones thereon.

26 Claims, 7 Drawing Figures

APPARATUS FOR EFFECTING ELECTRICAL CONNECTIONS WITH MULTIPLE CONTACT POINTS

BACKGROUND OF THE INVENTION

1. Field of the Invention

This invention relates to electrical interfacing board apparatus for effecting concurrent, respective, forceful engagements to make electrical connections with each of a multiplicity of generally coplanar, electrically conductive zones arranged in a permissably irregular pattern upon an electrical device such as, for example, a printed circuit board to be tested.

The invention is particularly concerned with providing an improved construction for such interfacing apparatus of type adaptable for use in effecting concurrent, electrical connections with the multitudinous, densely spaced and typically irregularly arranged test point zones of modern printed circuit boards, of configuration permitting the employment of the same interfacing board in the testing of printed circuit boards having differing patterns of test point zones, and, perhaps most significantly, of nature providing the required strength, precision and reliability while remaining technically and economically practicable to produce.

2. Description of the Prior Art

It has long been the common practice in the testing of printed circuit boards and similar devices to use some form of interfacing apparatus for effecting the normally temporary, electrical connections required to be made between the electrical circuitry of the testing equipment and the various electrically conductive zones of the device constituting electrical test points. Such interfacing apparatus has typically employed a plurality of contactor assemblies, usually of a spring biased pin type, for establishing electrically contacting engagement with each of the test point zones of the device under test (or some intermediate transition assembly for accomplishing a physical coordinate conversion), with each of such contactors being coupled by a wire or the like to the testing equipment circuitry.

An early practice in such interfacing apparatus was simply to provide one contactor assembly for each test point to be engaged and to mount such contactors in appropriate locations on a board or carrier assembly for aligning with and engaging the test point zones on a particular type of printed circuit boards when the contactor carrying board was suitably juxtaposed with the device being tested. Since the test point zones on a printed circuit board are typically arranged in an irregular pattern, this early approach necessitated the drilling of mounting holes for the contactor assemblies in the carrier board in an irregular pattern also. Another disadvantage of such approach was that, since the pattern in which the contactor assemblies were arranged and mounted on the carrier board was usually irregular and matched to the test point pattern of one particular type printed circuit board for which the interfacing apparatus was specifically designed, it was necessary to provide different interfacing apparatuses for each type of printed circuit board to be tested and to substitute a different interface apparatus in the testing fixture each time a different type of device was to be tested.

Because of the time, cost and inconvenience factors inherent in the above-mentioned early approach, effort was then directed to providing interfacing apparatus including an intermediate transition assembly that would accomplish physical coordinate conversion between the irregularly arranged test point zones of a particular type of printed circuit board and a set of logically corresponding contactor assemblies mounted in a regular pattern such as at the intersection points of a matrix. The Wickersham U.S. Pat. No. 3,654,585 illustrates this technique and disclosed an implementation thereof in which the transition assembly was in the nature of a board to be interposed between the circuit board under test and an array of regularly arranged contactor assemblies; the intermediate board was itself fabricated in a manner analogous to that employed in printed circuit boards, was provided on one face thereof with a set of contacts arranged in an irregular pattern for engaging the test point zones of the type of device to be tested, was provided on the opposite face thereof with a regularly arranged pattern of contacts to be engaged by the array of contactor assemblies, and was further provided with electrically conductive means passing through the transition board for interconnecting logically corresponding contacts on the opposite faces thereof. Subsequently, a refined implementation of such technique was commercialized in which the opposed contacts and electrical interconnections therebetween associated with the transition board were provided by bent electrically conductive pins reciprocably carried by the transition board with one end of the pins arranged in an irregular pattern to match the pattern of test points on the type of device to be tested and the other end of such pins regularly arranged in a matrix for engagement by the array of spring pin contactor assemblies. Such coordinate conversion transition assembly technique permitted the more economical fabrication of interfacing apparatus, since the spring pin contactor assemblies with which individual wires leading to the test equipment must be associated would be arranged and mounted in a regular matrix pattern. However, even with that improvement, the problem of needing to provide a different form of transition assembly for each type of printed circuit board or similar device to be tested still remained, and, although such technique has proved quite satisfactory in applications where relatively large quantities of only a limited number of specific device types are to be tested during a given time period, the expenses involved in providing differing transition assemblies for each type of device to be tested, as well as the need for substituting different transition assemblies in the testing fixture, continued to present a substantial economic burden for applications involving the testing of relatively small quantities of each of a number of types of custom designed printed circuit boards.

Accordingly, it has been recognized and found in practice that the over-all economies and convenience considerations in connection with the provision of interfacing apparatus for use in testing differing types of printed circuit boards or the like could best be served by providing the interfacing apparatus with an array of contactor assemblies arranged in a regular matrix pattern for engaging the printed circuit board under test at a multiplicity of regular intervals across the surface of the latter, even though only particular ones of such contactor assemblies would be engaging test point zones, while the others would be redundant insofar as the testing of each specific type of printed circuit board devices is concerned. With such last mentioned approach, however, one form of interfacing assembly can be employed in testing a diverse variety of specific types of printed circuit boards. Moreover, with the sophisticated circuitry available in the testing equipment typically employed in such applications, it is a simple matter for the testing equipment to electrically select which contactor assemblies it needs to be electrically coupled with for purposes of testing each specific type of printed circuit board to be handled. It will also be apparent that considerable time, expense and inconvenience are saved by this general approach by virtue of permitting the drillings necessary for the mounting of the contactor assemblies to be carried out in a regular pattern, rather than in an irregular pattern as required when each contactor assembly must be located to match the position of a corresponding test point zone on a device to be tested.

Concurrent development of the technology of fabrication of printed circuit boards themselves has, however, added additional and subtle aspects to the problem of providing a full solution to the problem. Briefly, the degree of both complexity and miniaturization of circuit paths on printed circuit boards have increased substantially, while the areas of circuitry on such devices have tended to remain the same or even increase, with the result that a typical modern printed circuit board presents a much larger multiplicity of test points with which electrical connections must be made during testing than was the case with earlier such devices, and such test point zones also tend to be smaller and at closer intervals than was the case with earlier such devices. This, in turn, necessitates the employment, with any interfacing apparatus which is to be adapted for use with diverse types of printed circuit boards, of a much larger multiplicity of contactor assemblies at much closer spacings than would have been required for the testing of most earlier types of printed circuit boards.

The increased number and density of contactor assemblies required in the mentioned type of regular array or matrix of same for use in testing modern printed circuit boards unexpectedly gives rise, however, to problems having mechanical as well as electrical implications in connection with the practical implementation of a type of apparatus that has heretofore been primarily thought of as being of electrical character. The more closely spaced drillings required for the mounting of dense matrix of spring pin contactor assemblies in an electrically insulative carrier board has significant influence upon the physical strength of that board. The engagement force required between the contacting portion of a spring pin contactor assembly and the corresponding test point zone on a device under test, in order to effect a sufficiently reliable and low electrical resistance, electrical contact therebetween, is preferably in the range of about 2-8 ounces per contactor assembly. Considering that a matrix interval of 0.05 inch between adjacent contactor assemblies will dispose about 400 of the latter within each square inch of the carrier board, it will be perceived that a force of between about 50 lbs. per square inch and 200 lbs. per square inch will be exerted back upon the carrier board in the direction of its thickness by the contactor assemblies when they are in operative engagement with a device under test. When it is further recognized that the contactor assembly carrier board of interfacing apparatus will normally be of length and width dimensions of at least several inches each in order to be employed in testing typical types of printed circuit boards, and that such contactor assembly carrier boards must normally be supported primarily along marginal portions thereof in order to provide clearance for egress of the multitude of wires leading from the individual contactor assemblies to the testing equipment, it will be appreciated that the contactor assembly carrier board or other assemblage utilized for that purpose must be able to withstand very substantial, aggregate, physical forces exerted in what would normally be its direction of greatest weakness, not only to avoid possible physical breakage, but also to minimize distortion that could adversely affect either the alignment thereof required for engagement with small test point zones of the device under test or altered electrical relationships between the already closely spaced contacting portions of the contactor assemblies which might adversely influence the testing results.

It might seem that a solution to the problem would be provided merely by increasing the thickness of the electrically insulative plate to an extent sufficient to provide the requisite physical strength. However, that approach has been found to be impractical in connection with the drilling of the holes through the contactor assembly carrier board required for mounting of the spring pin contactor assemblies and providing clearance for the connection wires individually leading therefrom, both by virtue of the tendency of drill bits to wander or deviate from their intended straight course when drilling in very thick plates of material (and especially the electrically insulative fiber glass material commonly employed in fabricating such boards), as well as the increased tendency toward breakage of the very fine bits necessarily employed, when attempting to drill through a very thick plate.

Again, it might appear that a satisfactory solution would be available through the mere expedient of separately drilling and then stacking a number of thinner plates having corresponding holes therein aligned to present the required physical strength in the composite carrier board assembly. It has been found, however, that even that approach does not alone provide a fully satisfactory solution. First, bearing in mind that a typical interfacing assembly for use in testing printed circuit boards of, say, 12 inch by 12 inch dimensions, would require the drilling of over 57,000 holes in each plate in order to provide for a matrix of contactor assemblies mounted at 0.05 inch intervals, it will be apparent that the amount of precision drilling required can compound very quickly with the number of plates to be utilized in a composite carrier board assembly. Secondly, with the high density of holes in such an assembly, it has been found that the physical strength of the individual plates, and thereby the composite assembly, tend to be weakened to an unexpectedly significant degree, thus leading to the necessity for employing an undesirable number of plates and the concomitant multiplication of the expensive, precision drilling operations required.

It is in this general context of previously inadequately practical solutions to the problem of providing economical, reliable, precision and versatile interfacing apparatus that the improved construction contemplated by this invention has been conceived and developed.

SUMMARY OF THE INVENTION

This invention solves the problems previously discussed by providing an improved construction for interfacing apparatus for use in effecting electrical connections with the test point zones of modern printed circuit boards or similar devices, which is both economically and technologically practical to produce and utilize.

The improved apparatus contemplated by my invention can be fabricated and assembled with high precision, involves a minimum of precision drilling operations and materials consistent with the requirements of the intended application, and has been found both reliable and convenient in use.

My currently preferred form of the improved interfacing apparatus employs a composite carrier board assembly formed by stacking and securing together a plurality of support plates and a plurality of backing plates. The support plates are drilled prior to assembly to provide the relatively small and closely spaced holes (of, say, 0.038 inch diameter) for mounting an array of contactor assemblies in a matrix pattern at the intersections of a 0.05 inch intervalled grid. The reinforcing plates are drilled prior to assembly to provide larger and more widely spaced openings (of, say, 0.078 inch diameter) in a regular matrix pattern at the intersections of a 0.1 inch intervalled grid. The drilled plates are stacked in a predetermined arrangement in which the central axes of the holes in the various support plates are aligned with each other, the central axes of the openings in the various backing plates are aligned with each other, and the central axis of each opening is aligned midway between the central axes of four adjacent holes with the proximate extremity of each opening partly overlapping the proximate extremity of the four adjacent holes to place the latter in communication with the associated opening at the interface between the support plates and the backing plates. The larger size and spacing of the openings as compared with the holes, as well as the offset between their central axes and the partial nature of the mentioned overlapping between adjacent extremities of each opening and four of the holes, not only minimizes the total number of drilling operations required and permits the backing plates to be thicker than the support plates, but also provides an enhanced reinforcing relationship in which the backing plates offer increased reinforcement for the support plates and the number of both of such types of plates required for interfacing apparatus of given length and width dimensions is minimized. After stacking and securement of the plates in their mentioned predetermined relationship, the contactor assemblies with lead wires attached thereto are installed by feeding the lead wire down through the selected hole and the opening associated with the latter, and the base portion of the contactor assembly is press-fitted into the hole. Each of the openings provides clearance for the lead wires associated with four contactor assemblies. I also prefer to make the support plate which will be in facing relationship with the device to be tested somewhat thinner than the remaining support plates, in order to facilitate drilling with the highest possible precision in such thinner support plate, so that the holes therein may serve as an accurate locator for the extremity of the base portion of the contactor assemblies nearest the device to be tested, thereby further assuring proper alignment of the contactor assemblies in substantially perpendicular arrangement to the flat surface of such locator support plate facing the device to be tested.

Further significant details of my improved construction will become clear from the more detailed description of my currently preferred embodiment of the invention hereinafter.

DESCRIPTION OF THE PREFERRED EMBODIMENT

A general background concerning the purpose and nature of interfacing apparatus of the class with which the invention is concerned, as well as a general summary of the primary elements and relationships involved in my improved construction have already been provided in earlier sections hereof, and the general scope of what I regard as my invention will be delineated in the claims that follow. Although those skilled in the art will appreciate that various dimensions and other details of the improved construction broadly contemplated by the invention may be varied or modified according to the particular application involved or other factors collateral to the essence of the invention, it remains to more specifically illustrate the invention by reference to my currently preferred embodiment of improved interfacing apparatus for use in testing typical, modern, printed circuit boards, as illustrated and generally designated by the reference numeral 10 in the accompanying drawings.

Various aspects of the improved construction of the interface apparatus 10 may be conveniently noted in the course of tracing the steps involved in its fabrication, and with reference to the various Figures of the drawings in an essentially sequential manner.

Figure 1:
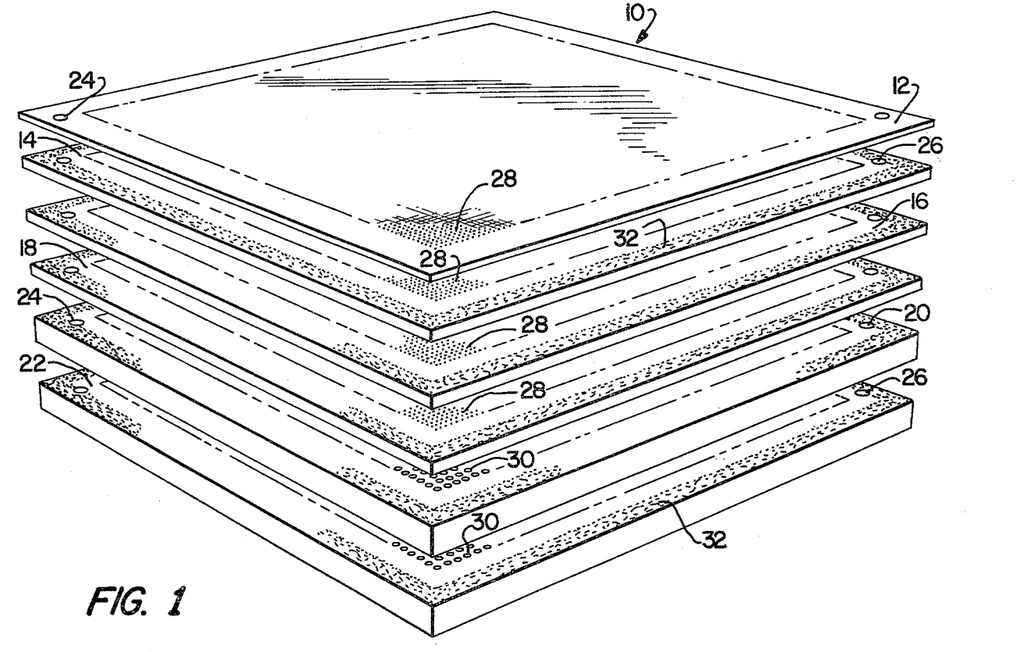
FIG. 1 is an exploded, perspective view of the support plates and the backing plates utilized in the preferred embodiment of my invention, after preliminary drilling but before final assembly thereof.

Accordingly, FIG. 1 shows in unassembled, exploded view fashion, but in the relative ordering relationship they will have when assembled, four successive support plates 12, 14, 16 and 18 and two backing plates 20 and 22. All of the plates 12 et seq. are preferably cut from sheets of G-10 fiber glass material, which is electrically insulative, and may be, say, about 14 inches square for use with a typical size of printed circuit boards having an area about 12 inches square bearing test point zones with which electrical connections are to be made. The support plates 12, 14, 16 and 18, when assembled in stacked relationship, present what may be referred to as the holding assembly 12 et seq., while the backing plates 20 and 22, when assembled in stacked relationship, present what may be referred to as the reinforcing assembly 20 et seq. It will be observed that the support plate 12, also herein called the locator plate, is significantly thinner than the other support plates 14, 16 and 18, and that the backing plates 20 and 22 are significantly thicker than any of the support plates 12, 14, 16 and 18. The preferred thicknesses are ⅛ inch for the locator plate 12, ¼ inch for each of the other support plates 14, 16 and 18, and ⅜ inch for each of the backing plates 20 and 22, providing an aggregate thickness when assembled in stacked relationship of ⅞ inch for the holding assembly 12 et seq., 1¼ inch for the reinforcing assembly 20 et seq., and 2⅛ inches for the electrically insulative plate portion of the interfacing apparatus 10. It will be apparent to those skilled in the art that differing numbers of plates, especially the backing plates 20 et seq., may be appropriate where the size of the printed circuit boards to be tested or the size or spacings of the drillings used depart from those herein noted for the embodiment and application being described for illustration.

Each of the locator plate 12 and the other support plates 14, 16 and 18, after cutting thereof to the desired length and width, are then drilled adjacent opposite corners thereof with a pair of alignment and tooling reference passages 24 and 26 of, say, about ¼ inch diameter (or slightly greater to tightly receive pins of that size), and are further drilled with a multiplicity of perforations 28 which respectively align when the support plates are subsequently stacked to present a corresponding multiplicity of substantially cylindrical holes through the holding assembly 12 et seq. The perforations 28 are of a diameter of 0.038 inch (or as required for accommodating the type of contactor assemblies to be mounted in the holes of the holding assembly 12 et seq.) and are arranged in a rectangular matrix pattern (only a portion of which is illustrated in the drawings) with their central axes located at the intersection of a grid having an interval of preferably 0.05 inch (and certainly not more than about 0.1 inch, if modern printed circuit boards are to be accommodated). With the preferred spacing interval of 0.05 inch between adjacent perforations 28, the density of the holes through the support assembly 12 et seq. presented thereby will be 400 holes per square inch.

The locator plate 12 will be adjacently facing the printed circuit board to be tested when the interfacing apparatus 10 is in operative position, and it is particularly important for proper alignment of the contactor assemblies of the interfacing apparatus 10 with the test point zones of a printed circuit board to be tested that the perforations 28 drilled in the plate 12 be both located with maximum precision and have their axes as nearly perpendicular to the circuit board facing surface of the plate 12 as possible; it is for this reason that the locator plate 12 is preferably thinner than the other support plates 14, 16 and 18, since this facilitates greater precision in drilling of the plate 12.

Similarly, after being cut to the desired length and width, the backing plates 20 and 22 are each drilled with a pair of alignment and tooling reference passages 24 and 26, like those for the support plates 12 et seq. and adapted to align with the latter, and are further drilled with a plurality of apertures 30 which respectively align when the backing plates are subsequently stacked to present a corresponding plurality of substantially cylindrical openings through the reinforcing assembly 20 et seq. The apertures 30 are of a diameter of approximately 0.078 inch (or about twice that of the holes in the holding assembly 12 et seq.) and are arranged in a rectangular matrix pattern (only a portion of which is illustrated in the drawings) with their central axes located at the intersections of a grid having an interval of twice the grid interval of the holes of the holding assembly 12 et seq. or about 0.1 inch in the preferred configuration. With the preferred spacing interval of 0.1 inch between adjacent apertures 30, the density of the openings through the reinforcing assembly 20 et seq. will be 100 openings per square inch. The greater diameter of the apertures 30, as compared with the perforations 28, permits the backing plates 20 et seq. to be much thicker than the support plates 12 et seq. without significant adverse effect upon drilling. The greater spacing of the apertures 30, as compared with the perforations 28, also results in lesser relative weakening of physical strength of the backing plates 20 et seq., as compared with the support plates 12 et seq., as a result of drilling. It will be understood, of course, that the major surfaces of each of the support plates 12 et seq. and the major faces of each of the backing plates 20 et seq. are substantially flat and substantially parallel to each other, and that the central axes of the perforations 28 and of the apertures 30 are substantially perpendicular to such major surfaces or faces of the plates 12 et seq. and the plates 20 et seq. respectively.

After drilling and cleaning of the support plates 12 et seq. and the backing plates 20 et seq., an epoxy or other suitable bonding material is applied, as at 32, to a marginal portion about ½ inch in width of each pair of the major surfaces of the support plates 12 et seq. and major faces of the backing plates 20 et seq. which will be interengaged when such plates are assembled into their stacked relationship.

Figure 2:
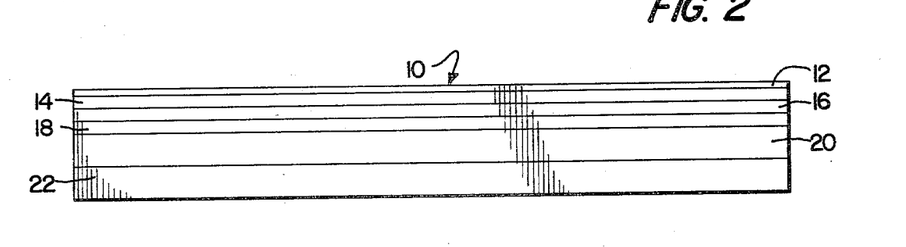
FIG. 2 is a side elevational view of the plates shown in FIG. 1, illustrating the manner in which they will be stacked when assembled.
Figure 3:
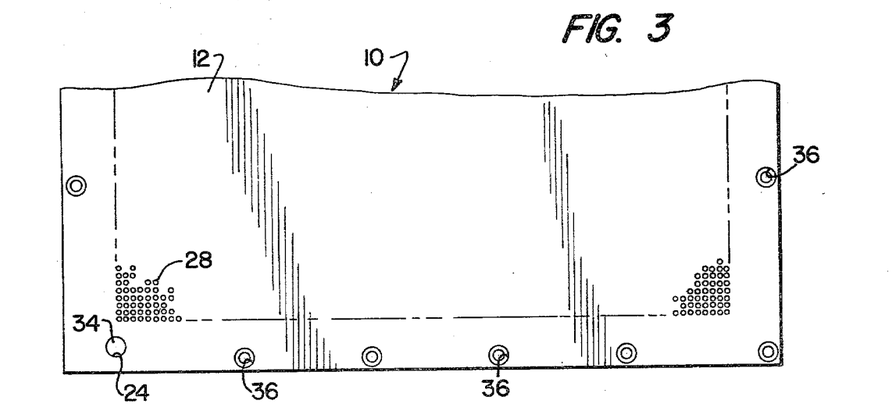
FIG. 3 is a fragmentary, top plan view of the uppermost support plate shown in FIGS. 1 and 2.

The support plates 12 et seq. and the backing plates are then stacked into their predetermined assembled relationship, as depicted in FIG. 2, with the backing plate 22 resting on a flat, rigid surface, and with a weight or pressure applied atop the locator plate 12 until the epoxy bonding material 32 has cured. During such stacking of the plates 12 et seq. and 20 et seq. for curing of the bonding material 32, tightly fitting pins 34 are inserted through the passages 24 and 26 of all of the plates, as indicated in FIG. 3, to assure that they are stacked in properly aligned relationship. When curing has been completed, the plates 12, 14, 16, 18, 20 and 22 will all have become laminated into a strong and rigid, effectively unitary, composite body adapted for employment as a carrier board for contactor assemblies.

Figure 4:
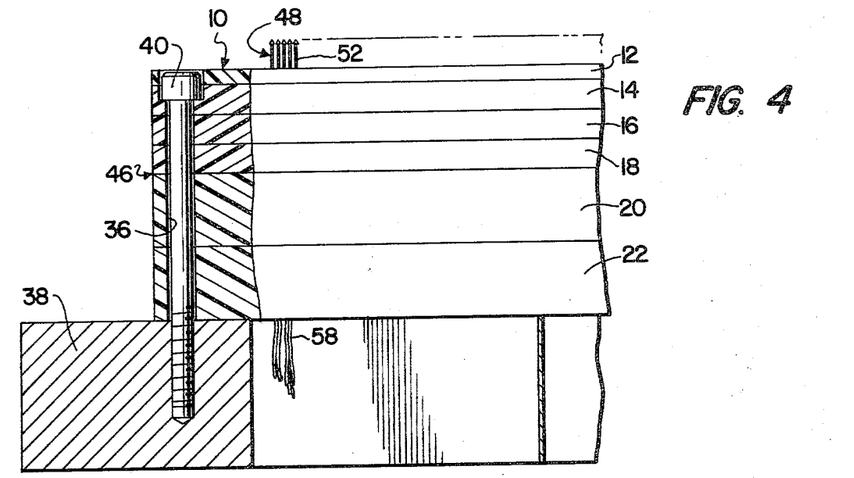
FIG. 4 is an enlarged, fragmentary, side elevational view of my assembled interfacing apparatus installed on a supporting frame part of the testing fixture in which the interfacing apparatus will be employed, with a portion of such figure being broken away and shown in cross-section to better depict the manner in which the interfacing apparatus is secured to such frame.

After such stacking and lamination of the plates 12, 14, 16, 18, 20 and 22 is completed, if such additional drilling was not already done at the time of the other drilling operations previously discussed, a plurality of countersunk mounting bores 36 will be drilled at intervals of about 2½ inches around the marginal portion of the laminated body, as shown in FIG. 3, and the body will be rigidly, but releasably, secured to the metal frame portion 38 of the testing fixture in which the interfacing apparatus 10 is to be used by means of bolts 40 passing through the bores 36 and threaded into the frame 38, as shown in FIG. 4.

Although those skilled in the art will appreciate that the advantages of the invention might be imperfectly enjoyed by employing apertures 30 in the backing plates 20 et seq. having a different size or locational relationship relative to the perforations 28 of the support plates 12 et seq. (such as sizing and locating the openings presented by the apertures 30 in such manner as to overlap with only two or more than four of the holes presented by the perforations 28 at their adjacent extremities or so as to overlap fully, rather than partially, with the holes they communicate with), the previously mentioned relationship of partial overlapping of each opening with four holes is my preferred construction and is believed to have advantages over the available alternatives. In order to better visualize the preferred relationship in such regard, reference is made to FIG. 6 and particularly the left half thereof in which the holes 42 presented by the aligned perforations 28 and the openings 44 presented by the aligned apertures 30 are depicted without any contactor assembly therein. The same matter may be further clarified by reference to the left half of FIG. 7, which shows the relationship between the holes 42 and the openings 44 from the face of the laminated body opposite from that depicted in FIG. 6.

Figures 5, 6, 7:
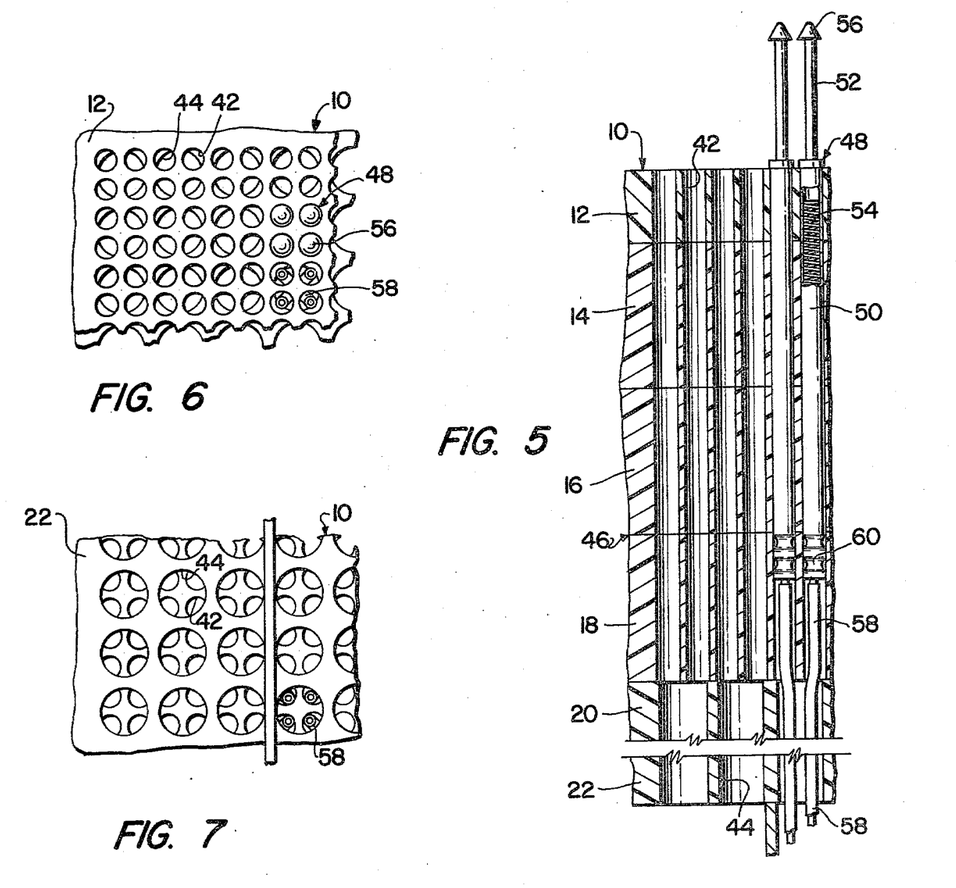
FIG. 5 is a further, substantially enlarged, cross-sectional view of a portion of my interfacing apparatus, particularly showing the general nature of the contactor assemblies and the manner in which they and their associated lead wires are arranged and mounted with respect to the support plates and the backing plates.
FIG. 6 is a fragmentary, enlarged top plan view on approximately the same scale as FIG. 5 showing the relationship between the holes in the support plates and the openings in the backing plates, and also indicating the relationship thereto of illustrative parts of contactor assemblies and lead wires associated with the latter.
FIG. 7 is a fragmentary, bottom plan view on approximately the same scale as FIGS. 5 and 6 showing the relationship between the openings in the backing plates and the holes in the support plates and also showing the relationship therto of illustrative lead wires associated with the contactor assemblies for one set of four holes.

With the laminated body, broadly designated 46 in FIGS. 4 and 5, fully fabricated and preferably mounted upon the frame 38, the next step in assembly will involve the installation of the contactor assemblies 48. Referring particularly to FIG. 5 but incidentally to FIG. 4 also, it will be seen that the preferred contactor assemblies 48 are of the conventional spring pin type and include an elongate, sleeve-like base portion 50, an elongate contacting portion 52 reciprocably extending axially from the base portion 50, and spring means 54 within the base portion 50 for yieldably biasing the contacting portion 52 outwardly from the base portion 50 in an axial direction. Such contactor assemblies 48 may be purchased with various types of engagement heads 56 forming a part of the contacting portion at the extremity thereof, although my preferred construction is to utilize contactor assemblies 48 having a somewhat pointed configuration for assuring an efficient electrical coupling between each contactor assembly 48 and the test point zone of the printed circuit board with which its head 56 will be engaged during operation. Although rigid pins could conceivably be employed in place of the contactor assemblies 48, the use of the yieldably biased spring pin type components for the assemblies 48 is preferred, in order to allow for slight irregularities from precise coplanarity of the test point zones of the printed circuit boards to be tested. The contactor assemblies 48 are formed of metallic, electrical conductive material and are so made as to assure good electrical continuity between the head 56, the remainder of the contacting portion 52 and the base portion 50 of the assembly 48. Although contactor assemblies 48 may be procured in which the contacting portions 52 are outwardly biased with various levels of force, the preferred construction utilizes contactor assemblies 48 providing biasing forces within the middle to upper part of the range of about 2-8 ounces per contactor assembly 48.

As shown in FIG. 5 and also indicated in FIG. 4, each contactor assembly 48 is provided with a lead wire 58. Each lead wire is preferably insulated and has an exposed portion of its conductive means electrically coupled with the base portion 50 of the corresponding contactor assembly 48 in some suitable manner, such as by crimping of the base portion 50 upon the exposed extremity of the conductor part of the wire 58, as indicated at 60.

The contactor assemblies 48 are individually installed and mounted in the body 46 by passing the distal end of the lead wire 58 first through the selected hole 42, thence through the corresponding opening 44 until the base portion 50 of the contactor assembly 48 has entered the hole 42. Insertion of the base portion 50 is then continued until it is fully seated and tightly received within the opening 42, it being understood that the holes 42 are of a diameter in relation to the outer diameter of the base portion 50 of the contactor assemblies 48 such that the base portions 50 will be essentially press-fitted into the holes 42. In the preferred construction, a contactor assembly 48 is installed in each of the holes 42 to provide a full, rectangular matrix of contactor assemblies 48, although it will be understood that, if an interfacing assembly 10 was to be fabricated with support plates 12 et seq. that had been pre-drilled with a full complement of perforations 28 but was to be employed only in connection with the testing of printed circuit boards having a lesser area in which its test point zones were located, then contactor assemblies 48 would need to be installed only in an appropriate sub-set of the holes 44.

In FIG. 6, the four holes 42 at the right center of the Figure are shown as having contactor assemblies 48 installed therein, and the four holes 42 at the lower right-hand corner of the Figure are depicted as if contactor assemblies 48 were provided therein but had been broken away to show the manner in which the lead wires 58 make the transition from the hole 42 into the corresponding opening 44 at the communicating extremities thereof. Such transition of the lead wires 58 is also shown from the other direction in the openings 44 depicted near the lower right-hand corner of the Figure. The overlapping relationship between the holes 42 and the openings 44 is also generally indicated in FIG. 5.

It should be observed that the preferred construction shown and described for purposes of illustrating the invention, assuming that a 12-inch by 12-inch matrix of contactor assemblies 48 is to be required, would involve drilling 57,600 small perforations 28 in each of the support plates 12, 14, 16 and 18 or a total of 230,400 perforations 28, and would require the drilling of 14,400 larger openings 44 in each of the backing plates 20 and 22 or a total of 28,800 apertures 30. Thus, an aggregate of 259,200 drilling operations would be required. This is, of course, a very substantial amount of drilling, but the magnitude thereof appears to be an inherent necessity of providing interfacing apparatus 10 of the sophisticated type now required for satisfactory testing of modern printed circuit boards. One of the significant advantages of the improved construction provided by this invention may be perceived by considering the amount of drilling that would be required, if the body 46 of the interfacing apparatus 10 were to be more conventionally fabricated to even a somewhat lesser aggregate thickness of 2 inches by laminating eight support plates each of a ¼ inch thickness and with such plates being drilled with the number of perforations 28 required to provide the same number of holes 42 for the mounting of a comparable matrix of contactor assemblies 48; each such plate would still require 57,600 perforations 28 per plate for an aggregate of 460,800 perforations 28 for the entire body 46 made in more conventional fashion, or nearly twice as many drilling operations as are required for the improved interfacing apparatus 10 provided by this invention. Those skilled in the art will also appreciate that, with the conventional method of fabrication mentioned, the lesser spacing between the perforations 28, as compared with the spacings of the apertures 30 employed in the apparatus 10 of this invention, would also necessitate the employment of a greater number of plates in the conventional construction in order to achieve the same over-all strength for the body 46.

Although it will be clear that various minor changes could be made from a number of the details of the preferred construction disclosed for purposes of illustrating the invention, without departing from the gist and essence of the latter, it is to be understood that the scope of the invention should be measured by the claims which follow and should be construed to include mechanical equivalents of the novel interfacing apparatus 10 provided by the invention.

I claim:

1. In apparatus for effecting concurrent, respective, forceful engagements to make electrical connections with each of a multiplicity of generally coplanar, electrically conductive zones arranged in a permisssably irregular pattern upon an electrical device such as, for example, a printed circuit board to be tested:

an electrically insulative holding assembly having a pair of oppositely facing, substantially flat surfaces thereon and provided with a multiplicity of holes extend therethrough and oppositely communicating with said surfaces, said holes having respective central axes and including a particular hole corresponding with each of said zones respectively, said holding assembly being adapted for disposition relative to said device in an operative position juxtaposing one of said surfaces in facing relationship with said zones with said axes of said particular holes in respective alignment with corresponding ones of said zones;

a multiplicity of electrically conductive contactor assemblies, including a contactor assembly for at least each of said particular holes respectively, each having a base portion mounted in a corresponding hole and a contacting portion extending from said base portion and away from said one surface in a direction substantially aligned with said axis of the corresponding hole for forceful engagement of said contacting portions with said device, including forceful engagement of said contacting portion of each of said contactor assemblies mounted in one of said particular holes with a corresponding one of said zones, when said holding assembly is in said operative position;

a reinforcing assembly having a substantially flat face thereon and provided with a plurality of openings extending therethrough and communicating with said face, said openings having respective central axes, at least certain of said openings having a larger, transverse, cross-sectional size than said holes;

means for securing said holding and reinforcing assemblies in a predetermined interengaged relationship to each other with said face of said reinforcing assembly in backing engagement with the other of said surfaces of said holding assembly, the arrangement of said axes of said holes, the arrangement of said axes of said openings and the relative, lateral, cross-sectional sizes of said holes and said openings being such that, when said holding and reinforcing assemblies are in said predetermined relationship thereof, the extremity of each of said openings adjacent said face is in communication with the extremity of a plurality of said holes adjacent said other surface; and electrically conductive, connecting means for each contactor assembly respectively, electrically coupled with said base portion of the latter and extending therefrom through the opening communicating with the hole in which the corresponding contactor assembly is mounted to a location at which said connecting means is adapted for being coupled with external electrical circuitry.

2. In apparatus as set forth in claim 1, wherein:
said surfaces are substantially parallel, and
said axes of said holes are substantially perpendicular to said surfaces.

3. In apparatus as set forth in claim 2, wherein:
said axes of said openings are substantially perpendicular to said face.

4. In apparatus as set forth in claim 2, wherein:
said axes of said holes are regularly disposed at locations defining intersection points of a grid-like pattern.

5. In apparatus as set forth in claim 4, wherein:
said axes of said openings are regularly disposed at locations defining intersection points of a grid-like pattern having its intersection points more widely spaced than those of said grid-like pattern of said axes of said holes.

6. In apparatus as set forth in claim 2, wherein:
said holding assembly includes a plurality of electrically insulative, support plates in stacked relationship.

7. In apparatus as set forth in claim 6, wherein:
said support plates include a primary locator plate presenting said one surface of said holding assembly and of lesser thickness than other of said support plates.

8. In apparatus as set forth in claim 6, wherein:
said holes in said holding assembly are presented by aligned perforations drilled through each of said support plates.

9. In apparatus as set forth in claim 8, wherein:
said axes of said holes are arranged in a rectangular, matrix pattern.

10. In apparatus as set forth in claim 9, wherein:
the spacing between said axes of adjacent ones of said holes is no greater than about 0.1 inch.

11. In apparatus as set forth in claim 10, wherein:
the spacing between said axes of adjacent ones of said holes is approximately 0.05 inch.

12. In apparatus as set forth in claim 11, wherein:
said holes are substantially cylindrical and have a diameter of approximately 0.038 inch.

13. In apparatus as set forth in either of claims 1 or 6, wherein:
said contacting portion of each of said contactor assemblies is yieldably biased in said direction away from said base portion thereof.

14. In apparatus as set forth in claim 13, wherein:
the force of yieldable biasing of each of said contacting portions away from the base portion associated therewith being in the range of about 2 to about 8 ounces.

15. In apparatus as set forth in either of claims 1 or 6, wherein:
said reinforcing assembly includes a plurality of electrically insulative, backing plates in stacked relationship.

16. In apparatus as set forth in claim 15, wherein:
said openings in said reinforcing assembly are presented by aligned apertures drilled through each of said backing plates.

17. In apparatus as set forth in claim 16, wherein:
said openings have a greater axial length than said holes.

18. In apparatus as set forth in claim 16, wherein:
said axes of said openings are arranged in a rectangular, matrix pattern.

19. In apparatus as set forth in claim 1, wherein:
the spacing between said axes of adjacent ones of said openings is approximately twice the spacing between said axes of adjacent ones of said holes.

20. In apparatus as set forth in claim 19, wherein:
said openings are substantially cylindrical and have a diameter of at least approximately twice the diameter of said holes.

21. In apparatus as set forth in claim 20, wherein:
said openings have a diameter of approximately 0.078 inch.

22. In apparatus as set forth in claim 20, wherein:
the extremity of each of said openings adjacent said face is in communication with the extremity of four of said holes adjacent said other surface.

23. In apparatus as set forth in claim 1, wherein:
the extremity of each of said openings adjacent said face partially overlaps with the extremity of each of the holes with which it is in communication.

24. In apparatus as set forth in claim 1, wherein:
said securing means includes means bonding a marginal portion of said face of said reinforcing assembly to a marginal portion of said other surface of said holding assembly.

25. In apparatus as set forth in claim 24, wherein:
said support plates and said backing plates are formed of fiberglass material, and
marginal portions of adjacent ones of said support plates and said backing plates are bonded together with an electrically insulative epoxy bonding material.

26. In apparatus as set forth in claim 1, wherein:
said holding assembly includes a plurality of electrically insulative, support plates in stacked relationship,
said reinforcing assembly includes a plurality of electrically insulative, backing plates in stacked relationship,
said backing plates being of greater thickness than said support plates.

* * * * *

UNITED STATES PATENT AND TRADEMARK OFFICE
CERTIFICATE OF CORRECTION

PATENT NO. : 4,311,352
DATED : January 19, 1982
INVENTOR(S) : Ralph W. Kochsmeier It is certified that error appears in the above-identified patent and that said Letters Patent are hereby corrected as shown below:

In Claim 1, at line 32 of column 11, "extend" should read --- extending ---.

Signed and Sealed this

Sixth Day of April 1982

[SEAL]

Attest:

GERALD J. MOSSINGHOFF

Attesting Officer     Commissioner of Patents and Trademarks